United States Patent
Sudo

(10) Patent No.: US 10,636,497 B2
(45) Date of Patent: Apr. 28, 2020

(54) SEMICONDUCTOR MEMORY DEVICE, MANUFACTURING METHOD THEREOF AND OUTPUT METHOD OF DATA STROBE SIGNAL

(71) Applicant: Winbond Electronics Corp., Taichung (TW)

(72) Inventor: Naoaki Sudo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/111,219

(22) Filed: Aug. 24, 2018

(65) Prior Publication Data

US 2019/0180828 A1 Jun. 13, 2019

(30) Foreign Application Priority Data

Dec. 13, 2017 (JP) ................. 2017-238392

(51) Int. Cl.
G11C 16/26 (2006.01)
G11C 16/32 (2006.01)
H01L 25/00 (2006.01)
H01L 25/065 (2006.01)
G11C 16/00 (2006.01)

(52) U.S. Cl.
CPC .............. G11C 16/32 (2013.01); G11C 16/00 (2013.01); G11C 16/26 (2013.01); H01L 25/0657 (2013.01); H01L 25/50 (2013.01)

(58) Field of Classification Search
CPC ......... G11C 16/32; G11C 16/26; G11C 16/00; H01L 25/0657; H01L 25/50
See application file for complete search history.

(56) References Cited

U.S. PATENT DOCUMENTS

| 6,198,685 | B1 * | 3/2001 | Sudo | ............ | G11C 8/08 |
| | | | | | 365/230.06 |
| 6,269,029 | B1 * | 7/2001 | Suh | ............ | G11C 7/1006 |
| | | | | | 365/189.06 |
| 6,301,180 | B1 * | 10/2001 | Sudo | ............ | G11C 7/065 |
| | | | | | 365/191 |

(Continued)

FOREIGN PATENT DOCUMENTS

| CN | 103608793 | 2/2014 |
| JP | 2008300469 | 12/2008 |

(Continued)

OTHER PUBLICATIONS

"Office Action of Taiwan Counterpart Application," dated Feb. 14, 2019, p. 1-p. 9.

*Primary Examiner* — Khamdan N. Alrobaie
(74) *Attorney, Agent, or Firm* — JCIPRNET

(57) ABSTRACT

A semiconductor memory device suppressing a shift between data output from a plurality of memory chips and a DQS signal. A flash memory device of the disclosure includes memory chips, a plurality of IO terminals capable of inputting and outputting data, and a DQS terminal. Each of the memory chips includes an output circuit used to output data and a DQS output circuit. The DQS output circuit is used to output the DQS signal for defining a timing of the data output from the output circuit. The DQS signal output from each of the DQS output circuits of the memory chips is supplied to the DQS terminal.

11 Claims, 3 Drawing Sheets

(56) References Cited

U.S. PATENT DOCUMENTS

| | | | |
|---|---|---|---|
| 6,333,875 B1 * | 12/2001 | Shinozaki | G11C 7/1066 |
| | | | 365/193 |
| 6,664,837 B1 * | 12/2003 | Oh | H03K 5/133 |
| | | | 327/270 |
| 9,158,873 B1 | 10/2015 | Chong et al. | |
| 9,281,049 B1 | 3/2016 | Magee et al. | |
| 2001/0018725 A1 * | 8/2001 | Shin | G11C 7/1045 |
| | | | 711/105 |
| 2001/0050582 A1 * | 12/2001 | Shinozaki | H03K 17/04106 |
| | | | 327/170 |
| 2005/0281096 A1 | 12/2005 | Bhakta et al. | |
| 2009/0230947 A1 * | 9/2009 | Sumita | H03K 5/12 |
| | | | 324/76.11 |

FOREIGN PATENT DOCUMENTS

| | | |
|---|---|---|
| JP | 2014057077 | 3/2014 |
| TW | 201011752 | 3/2010 |

\* cited by examiner

SEMICONDUCTOR MEMORY DEVICE, MANUFACTURING METHOD THEREOF AND OUTPUT METHOD OF DATA STROBE SIGNAL

CROSS-REFERENCE TO RELATED APPLICATION

This application claims the priority benefit of Japan application serial no. 2017-238392, filed on Dec. 13, 2017. The entirety of the above-mentioned patent application is hereby incorporated by reference herein and made a part of this specification.

BACKGROUND OF THE INVENTION

1. Field of the Invention

The disclosure relates to a semiconductor memory device in which a plurality of dies or chips are stacked, and more particularly, to a flash memory installed with functions for outputting a data strobe signal (DQS signal).

2. Description of Related Art

Multichip package is formed by stacking a plurality of identical or different chips or dies in one package. Specifically, a storage capacity may be expanded by stacking identical memory chips, or different memory functions may be provided by stacking different memory chips. For example, in a non-volatile semiconductor memory device of Patent Document 1, a plurality of memory array chips are stacked with a control chip for controlling the memory array chips, and a through electrode of the memory array chip is aligned with a through electrode of the control chip to conduct an electrical connection between two through electrodes. Further, in a semiconductor apparatus of Patent Document 2, a master flash memory chip is stacked with a slave flash memory chip, non-core circuits are taken out from the slave flash memory chip, and signal and voltage required in operations of the apparatus are provided to the slave flash memory chip from the master flash memory chip.

PRIOR ART DOCUMENT

Patent Document

Patent Document 1: Japanese Patent Publication No. 2008-300469
Patent Document 2: Japanese Patent Publication No. 2014-57077

Problems to be Solved by the Disclosure

By including a plurality of memory chips in one package, a storage capacity of a storage device can actually be increased. Also, by including a plurality of memory chips, a bit width of data that can be input/output by a memory apparatus may be further increased.

As for a flash memory apparatus, a memory capacity may be further increased by stacking multiple memory chips. In addition, in a flash memory chip installed with a serial peripheral interface (SPI) function, data can be input/output in synchronization with a serial clock signal supplied from an external part, and a higher speed for inputting and outputting data can be realized by further increasing a frequency of the serial clock signal.

However, as the higher speed of data output from the flash memory apparatus being improved, a timing for obtaining data becomes highly sensitive in a host computer. Accordingly, by disposing a DQS terminal in the flash memory apparatus, the DQS terminal can then output a data strobe signal for defining a timing of output data (hereinafter, also referred to as the DQS signal) so the host computer can observe the DQS signal output from the DQS terminal so as to obtain the data output from the flash memory apparatus.

FIG. 1 shows a schematic structure of a flash memory apparatus with a plurality of memory chips stacked in prior art. A flash memory apparatus 10 includes a memory chip (die 1) 20, a memory chip (die 2) 30 stacked with the memory chip 20 and an external terminal part 40 electrically connected to those memory chips. The memory chip 20 includes, for example, an input/output circuit 22 for outputting/outputting data of 4-bit width and a DQS output circuit 24 used to output a DQS signal for defining a timing of data output from the input/output circuit 22. Four output nodes of the input/output circuit 22 are electrically connected to input/output terminals IO_0 to IO_3 of the external terminal part 40, respectively. An output node of the DQS output circuit 24 is electrically connected to a DQS terminal of the external terminal part 40.

The memory chip 30 has a similar structure as the memory chip 20. Output nodes of an input/output circuit 32 of the memory chip 30 are electrically connected to input/output terminals IO_4 to IO_7 of the external terminal part 40, respectively. Here, because only one DQS terminal is disposed in the flash memory apparatus 10, an output node of a DQS output circuit 34 of the memory chip 30 is not connected, i.e., not connected to the DQS terminal.

In order to generate the DQS signal having the same delay characteristic as the data output from the input/output circuit 22 (32), the DQS output circuit 24 (34) includes an output driver obtained by duplicating an output driver of the input/output circuit 22 (32). FIG. 2 shows an example of the output driver included by the DQS output circuit. The output driver includes a plurality of inverters. By inputting a shared signal (e.g., a clock signal) to a gate of each of the inverters, output nodes Qn of the inverters are connected in a shared manner so the DQS signal can be output from the output nodes Qn. Because the output driver of the DQS output circuit is duplicated from the output driver of the input/output circuit, the DQS signal output from the DQS output circuit can be output while having the same gate delay as the data output from the input/output circuit.

Here, although the memory chips are designed and manufactured to satisfy desired operational conditions, there can still be deviations in circuits between the memory chips due to errors or machines in the manufacturing process. That is to say, a shift may be generated between a timing of data output from the memory chip 20 and a timing of data output from the memory chip 30.

FIG. 3 shows a relationship between the timings of the data output from the memory chip 20 and the memory chip 30 and the DQS signal. At a timepoint t1, when the DQS signal is output from the DQS output circuit 24 and rises from L level (logic low level) to H level (logic high level), the data with the identical timing is output from the input/output circuit 22 of the memory chip 20. That is to say, the DQS signal appearing at the DQS terminal has the identical timing as the data appearing at the input/output terminals IO_0 to IO_3. However, if a delay time of the data output from the memory chip 30 is longer than a delay time of the data output from the memory chip 20, the data output from the memory chip 30 would appear at the input/output terminals IO_1 to IO_7 at a timepoint t2 after a duration td started from the timepoint t1. That is to say, a shift of the duration td is generated between the timings of the DQS signal appearing at the DQS terminal and the data appearing at the input/output terminals IO_4 to IO_7. If the shift td is large, the host computer may not be able to accurately obtain the data output from the memory chip 30 based on the DQS signal.

SUMMARY OF THE INVENTION

The disclosure aims to solve aforesaid problem in prior art by providing a semiconductor memory device for suppressing a shift between data output from a plurality of memory chips and a DQS signal.

Technical Means for Solving the Problem

In a semiconductor memory device of the disclosure having a plurality of memory chips, each of the memory chips includes an output circuit for outputting data, and a DQS output circuit outputting a data strobe signal for defining a timing of the data output from the output circuit. The semiconductor memory device further includes a plurality of output terminals capable of outputting the data output from each of the output circuits of the memory chips to an external part and one DQS terminal for outputting the data strobe signal to the external part, and supplies the data strobe signal from each of the DQS output circuits of the memory chips to said one DQS terminal.

In an embodiment, the output circuit of each of the memory chips includes n parallel inverters for outputting the data (n is an integer being 2 or greater), the DQS output circuit of each of the memory chips includes n parallel inverters obtained by duplicating n said parallel inverters of the output circuit, and each of the DQS output circuits supplies the data strobe signal output by a part of the inverters fewer than the n parallel inverters to the DQS terminal.

In an output method of data strobe signal of the disclosure for a semiconductor memory device having a plurality of memory chips, output nodes of each of output circuits are connected with a plurality of external terminals by supplying data output from each of the output circuits of the memory chips to the external terminals, and an output node of each of DQS output circuits is connected with one DQS terminal by supplying a data strobe signal output from each of the DQS output circuits of the memory chips to said one DQS terminal. When the data are output to an external part from the external terminals, said one DQS terminal outputs a data strobe signal for defining a timing of the data output from the external terminals to the external part.

In an embodiment, the output circuit of each of the memory chips includes n parallel inverters for outputting the data (n is an integer being 2 or greater), and the DQS output circuit of each of the memory chips includes n parallel inverters obtained by duplicating n said parallel inverters of the output circuit.

In a manufacturing method of the disclosure for a semiconductor memory device having a plurality of memory chips being stacked, m said memory chips are prepared (m is an integer being 2 or greater). In each of the memory chips, an output circuit for outputting data includes n parallel inverters (n is an integer being 2 or greater), and the DQS output circuit of each of the memory chips for outputting the data strobe signal includes n parallel inverters obtained by duplicating n said parallel inverters of the output circuit. m said memory chips are stacked, and a setup is performed on each of the DQS output circuits by supplying the data strobe signal output from n/m said parallel inverters to one DQS terminal by each of DQS output circuits of m said memory chips.

Based on the disclosure, by providing the DQS signal output from the DQS circuit of each of the memory chips to one DQS terminal, the shift (in terms of duration) between the data output from each of the memory chips and the DQS signal may be suppressed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
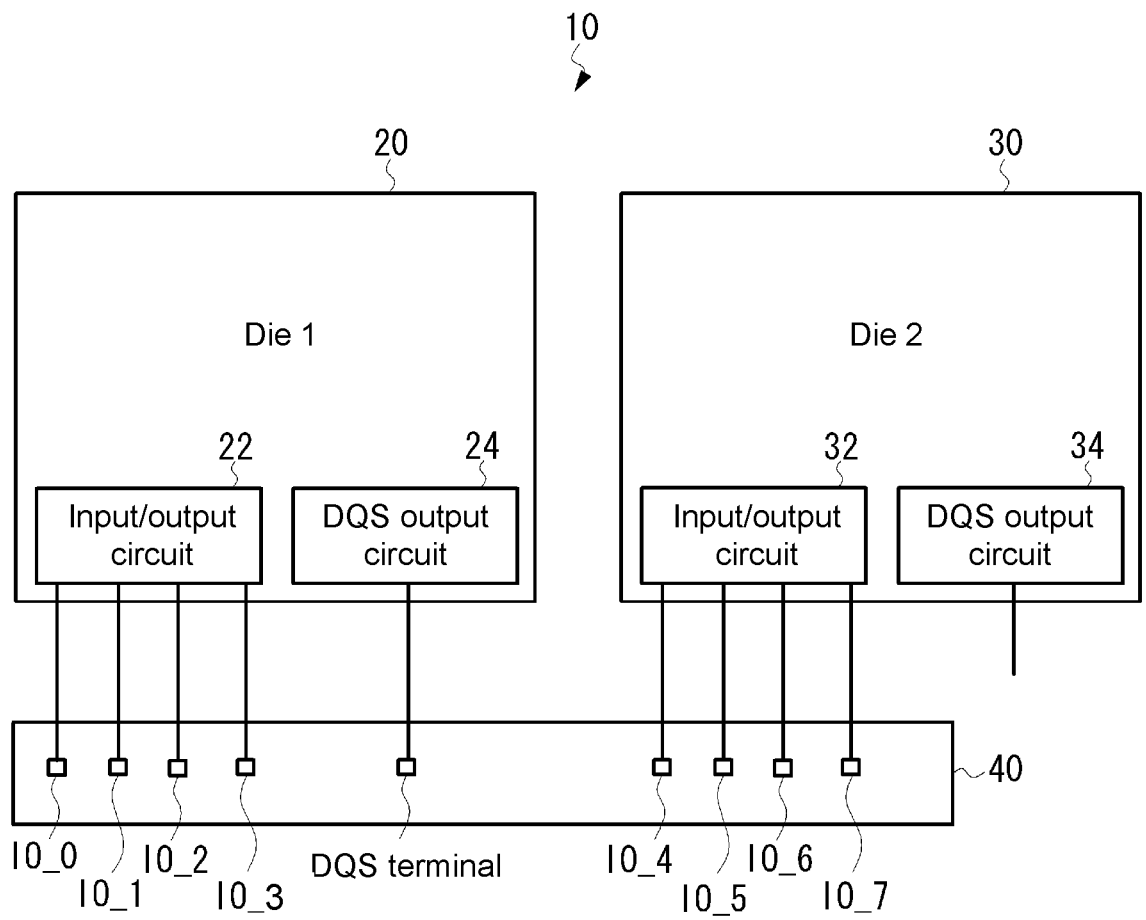
FIG. 1 is a diagram showing a schematic structure of a flash memory apparatus having a plurality of stacked memory chips in prior art.

Reference will now be made in detail to the present preferred embodiments of the disclosure, examples of which are illustrated in the accompanying drawings. Wherever possible, the same reference numbers are used in the drawings and the description to refer to the same or like parts.

In the following paragraphs, details of the embodiments of the disclosure would be described with reference to the accompany drawings. A semiconductor memory device of the disclosure is a multichip apparatus having a plurality of memory chips included in one package, and more preferably, a flash memory apparatus formed by stacking a plurality of NAND flash memory chips. Nonetheless, the semiconductor memory device of the disclosure may also be include memory chips like a NOR memory chip different from the NAND memory chip, or a dynamic random access memory (DRAM). Further, the flash memory chip can be installed with functions of a serial interface for inputting/outputting data in synchronization with a serial clock signal.

EMBODIMENTS

Figure 4:
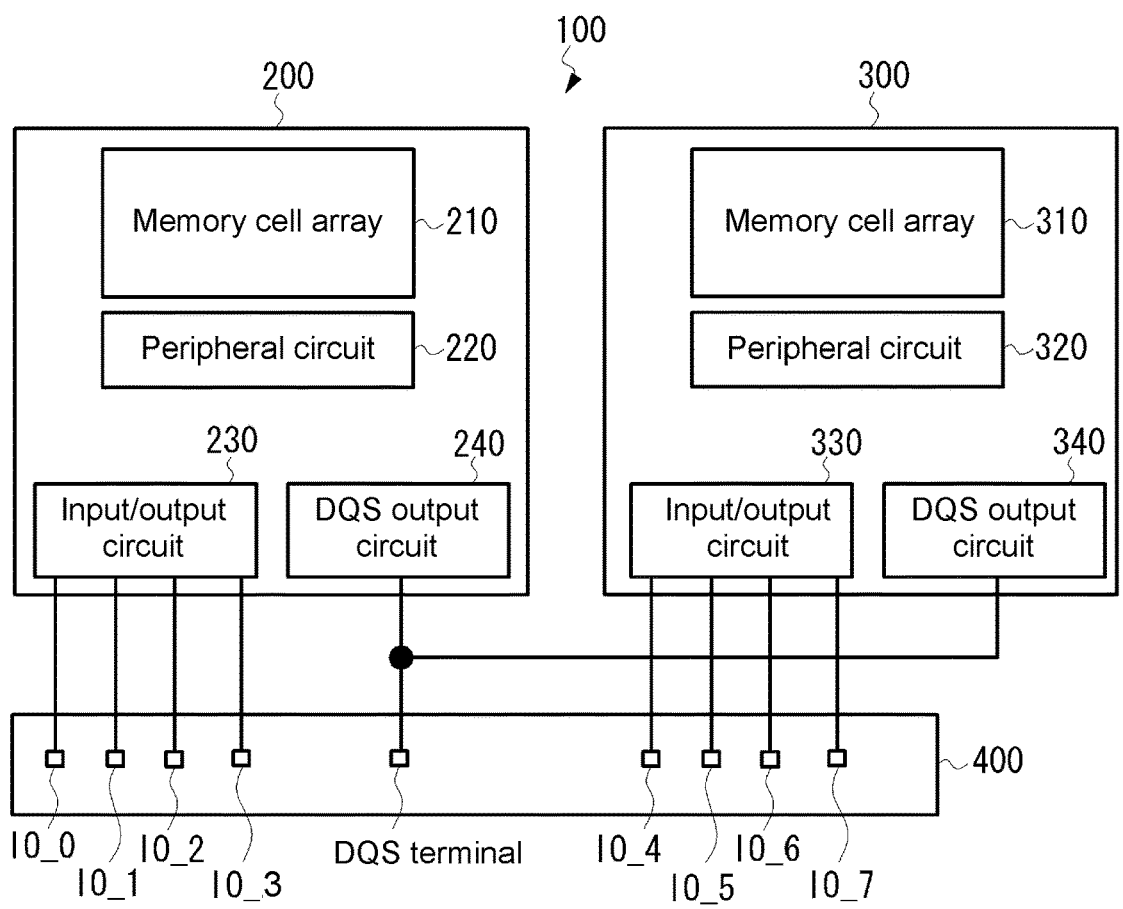
FIG. 4 is a diagram showing a schematic structure of a flash memory apparatus according to an embodiment of the disclosure.

FIG. 4 shows a schematic structure of a flash memory apparatus according to an embodiment of the disclosure. A flash memory apparatus 100 includes, for example, a memory chip 200, a memory chip 300, and an external terminal part 400 that provides an interface for an external host computer. Here, although two stacked memory chips are illustrated as an example, the number of the stacked memory chips may also be three or more. The flash memory apparatus 100 includes, for example, a ball grid array (BGA) package or a chip scale package (CSP). In the BGA package, the stacked memory chips 200 and 300 are installed on a flexible circuit substrate through flip chip or electrically connected to the circuit substrate through wire-bonding so as to form a plurality of ball-shaped terminals as external terminals on the back side of the flexible circuit substrate.

The memory chip 200 and the memory chip 300 are formed by using the same chip. In an embodiment, for example, the memory chip 200 may be assigned as a master chip and the memory chip 300 may be assigned as a slave chip through a fuse metal option or a bonding option.

The memory chip 200 includes a memory cell array 210 formed with a plurality of NAND sting units; a peripheral circuit 220 including a row decoder/driver circuit, a page buffer/sense circuit, a column decoder, a controller, an internal power generating circuit and so on; an input/output circuit 230 and a DQS output circuit 240 for outputting a DQS signal. During a reading operation, the memory chip 200 outputs page data read from the memory cell array 210 from the input/output circuit 230. Alternatively, during a programming operation, the memory chip 200 programs data input from the input/output circuit 230 at a selected page of the memory cell array 210. Further, during an erasing operation, the memory chip 200 erases a selected block of the memory cell array 210.

The memory chip 300 has the same structure as the memory chip 200 and includes a memory cell array 310, a peripheral circuit 320, an input/output circuit 330 and a DQS output circuit 340. In an embodiment, an address space of the memory cell array 210 of the memory chips 200 is identical to an address space of the memory cell array 310 of the memory chip 300. When the host computer accesses the flash memory apparatus 100, the memory chip 200 and the memory chip 300 are selected at the same time. For example, during the reading operation, data read from the memory chip 200 and data read from the memory chip 300 are output from input/output terminals IO_0 to IO_7 at the same time.

For example, the input/output circuit 230 of the memory chip 200 has a data structure of 4-bit width (×4), and four output nodes of the input/output circuit 230 are electrically connected to the input/output terminals IO_0 to IO_3 of the external terminal part 400, respectively. Similarly, four output nodes of the input/output circuit 330 of the memory chip 300 are electrically connected to the input/output terminals IO_4 to IO_7, respectively. Further, in this embodiment, the output node of the memory chip 200 for outputting the DQS signal of the DQS output circuit 240 and the output node of the memory chip 300 for outputting the DQS signal of the DQS output circuit 340 are electrically connected to one DQS terminal of the external terminal part 400 in a shared manner. In other words, the DQS signal output from the DQS output circuit 240 and the DQS signal output from the DQS output circuit 340 are supplied to one DQS terminal such that a combined component of the two DQS signals appears on the DQS terminal.

Further, in addition to the input/output terminals IO_0 to IO_7 and the DQS terminal, the external terminal part 400 may also include terminals like a terminal for inputting a control signal (address latch enable, command latch enable, etc.), an external terminal for inputting a busy signal/ready signal, a terminal for inputting clock signal and the like. The external terminal part 400 provides an interface for transceiving signals between the flash memory apparatus 100 and the host computer.

Figure 2:
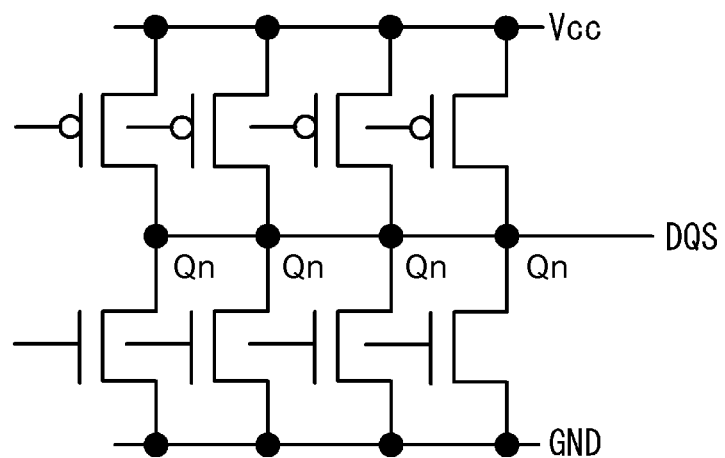
FIG. 2 is a diagram showing an example of the output driver of the DQS output circuit of the memory chip in prior art.
Figure 3:
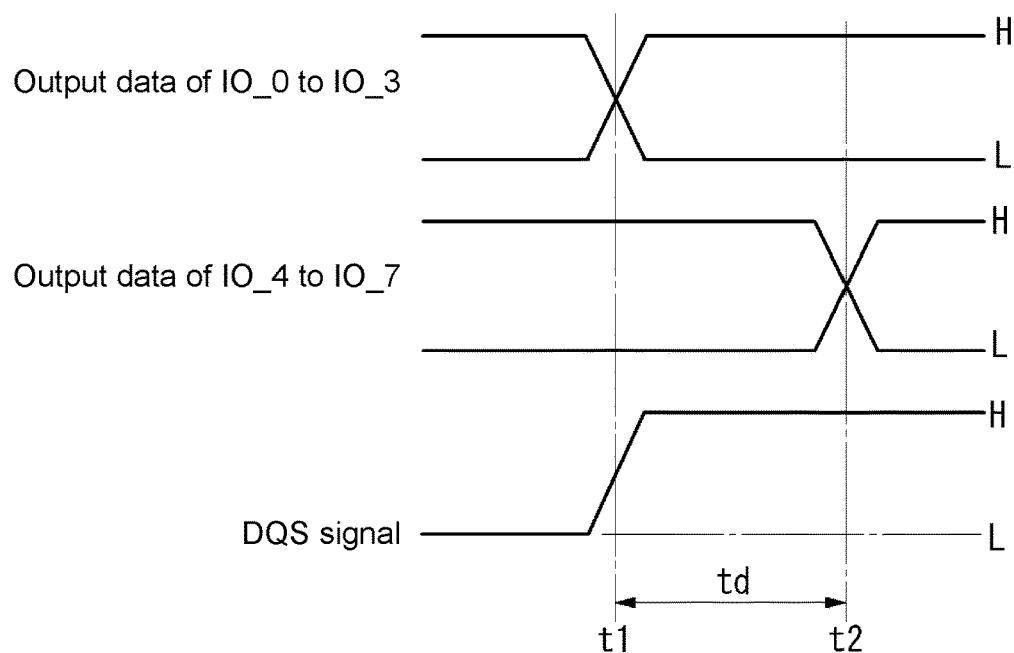
FIG. 3 is a diagram showing a relationship between the timings of the DQS signal and data output from each of the memory chips in prior art.

Next, the DQS output circuit 240 and the DQS output circuit 340 of the memory chip 200 and the memory chip 300 of the present embodiment are described in more details below. In the case where the input/output circuit of one memory chip has an output driver connected with four parallel inverters as shown in FIG. 2, the DQS output circuit would have an output driver connected with four parallel inverters duplicated from said output drivers. When the memory chip 200 or the memory chip 300 is stored in the package in form of one single chip, the DQS output circuit 240 or the DQS output circuit 340 outputs the DQS signal from the output driver connected with the four parallel inverters.

Figure 5:
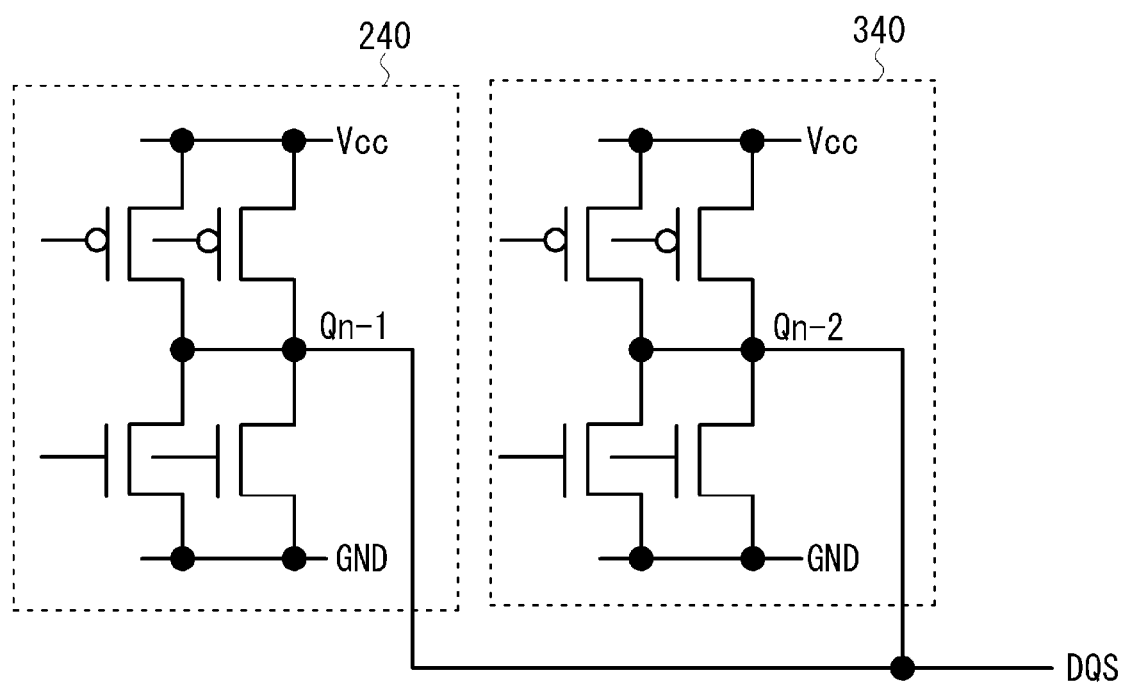
FIG. 5 is a diagram showing input drivers of DQS output circuits of the stacked memory chips according to an embodiment of the disclosure.

In this embodiment, when the memory chip 200 and the memory chip 300 are stacked in one package, each of the DQS output circuit 240 and the DQS output circuit 340 outputs the DQS signal by a part of the inverters fewer than the four parallel inverters. In a preferred embodiment, as shown in FIG. 5, the output driver of the DQS output circuit 240 operates through two parallel inverters. Similar, the output driver of the DQS output circuit 340 operates through two parallel inverters. Here, an output node Qn-1 of half of the inverters of the DQS output circuit 240 and an output node Qn-2 of half of the inverters of the DQS output circuit 340 are connected to the DQS terminal.

The method for making half of the inverters unable to operate is arbitrary. For example, in the case where the memory chips are being stacked (as multichip), the output nodes of the two parallel inverters may be connected to the DQS terminal and the output nodes of the remaining two parallel inverters are separated from the DQS terminal through a fuse option, a metal option or a bonding option.

In this way, when the memory chip 200 and the memory chip 300 are stacked, the DQS signal output from the output node Qn-1 of the two parallel inverters of the DQS output circuit 240 and the DQS signal output from the output node Qn-2 of the two parallel inverters of the DQS output circuit 340 may be supplied to one DQS terminal.

Figure 6:
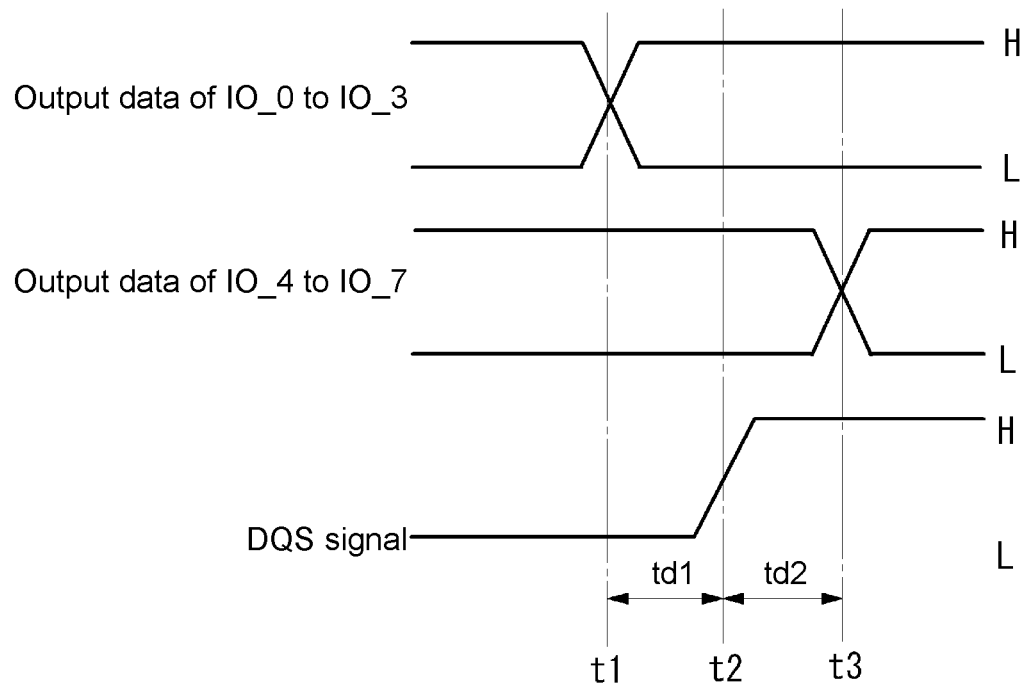
FIG. 6 is a diagram showing a relationship between the timings of the DQS signal and data output from each of the memory chips according to an embodiment of the disclosure.

FIG. 6 is a diagram showing a relationship between the timings of the DQS signal and data output from each of the of the memory chips in the present embodiment. Here, it is set that, a delay amount (a gate delay of output inverter) of data output from the memory chip 300 is relatively larger, as compared to a delay mount of data output from the memory chip 200. Even if the two memory chips are identical, circuit elements of the two memory chips may still have deviations due to errors and deviations in the manufacturing process. For example, transistors of the output drivers of the two memory chips may have different sizes. Consequently, the delay amount of the data output from the output driver of the input/output circuit 240 of the memory chip 200 would not necessarily be identical to the delay amount of the data output from the output driver of the input/output circuit 340 of the memory chip 300.

For example, during the reading operation of the flash memory apparatus 100, as shown in FIG. 6, in view of the data read from the memory chip 200 that appear at the input/output terminals IO_0 to IO_3 at a timepoint t1 and the data read from the memory chip 300 that appear at the input/output terminals IO_4 to IO_7 at a timepoint t3, the data output by the memory chip 300 is relatively delayed as compared to the data output by the memory chip 200. On the other hand, the DQS signal shows a migration from L level to H level at a timepoint t2, which is approximately at the middle between the timepoint t1 and the timepoint t3, due to the output data appearing at the input/output terminals IO_0 to IO_7. In response to the migration of the DQS signal to H level at the timepoint t2, the host computer obtains the output data appearing at the input/output terminals IO_0 to IO_7 of the flash memory apparatus 100.

As shown in FIG. 5, the DQS signal is a signal obtained by combining the DQS signal output from the two parallel output drivers of the DQS output circuit 240 of the memory chip 200 and the DQS signal output from the two parallel output drivers of the DQS output circuit 340 of the memory chip 300. Compared to the memory chip 300, the delay amount of the data output from the memory chip 200 is relatively smaller. Therefore, it can be speculated that, the size of a P-type Metal Oxide Semiconductor (PMOS) transistor and an N-type Metal Oxide Semiconductor (NMOS) transistor constituting the output driver of the memory chip 200 is larger than the size of the PMOS transistor and the NMOS transistor constituting the output driver of the memory chip 300, and thus the transistors of the memory chip 200 may have a higher driving capability.

When a driving capability of the transistor is higher, a driving current for pulling up or pulling down the output node becomes larger, a slope of the migration becomes steeper, and an operating speed becomes faster. On the other hand, when the driving capability of the transistor is lower, the driving current for pulling up or pulling down the output node becomes smaller, said slope become less steeper, and the operating speed becomes slower. In this embodiment, because the DQS signal output from the output driver of the memory chip 200 and the DQS signal output from the output driver of the memory chip 300 are supplied to one DQS terminal, the DQS signal obtained by combining components of the two DQS signals would appear at the DQS terminal. As a result, the DQS signal appearing at the DQS terminal starts the migration approximately at the middle between a timing when the DQS signal of the memory chip 200 starts the migration and a timing when the DQS signal of the memory chip 300 starts the migration. Accordingly, a shift between the timings of the output data appearing at the input/output terminals IO_0 to IO_3 of the flash memory apparatus 100 and the DQS signal appearing at the DQS terminal is a duration td1 from the timepoint t1 to the timepoint t2. Also, a shift between the timings of the output data appearing at the input/output terminals IO_4 to IO_7 and the DQS signal appearing at the DQS terminal is a duration td2 from the timepoint t2 to the timepoint t3. Therefore, said shifts are smaller than the shift td between the timings in the flash memory in prior art.

In the foregoing embodiments, the DQS output circuit and the input/output circuit having the output driver connected with the four parallel inverters are provided simply for Illustrative purpose. Based on required driving characteristics, the number of the connected inverters may be changed freely. Further, in the foregoing embodiments, although two stacked memory chips are provided as an example, the number of the stacked memory chips may also be three or more. In the case where a DQS output circuit of one memory chip includes an output driver connected with n parallel inverters and m said memory chips are stacked, the DQS output circuit of each of said memory chips outputs a DQS signal from n/m said parallel inverters enabled in the output driver so m said DQS signals output from the output drivers each connected with n/m said parallel inverters can be supplied to one DQS terminal.

In the foregoing embodiment, although it is illustrated that the memory chip has a data registration/output structure of 4-bit width (×4), the disclosure is not limited thereto, and the bit width may also be ×8, ×16 and so on. In the foregoing embodiments, although the stacked flash memory chips are used as example, the disclosure is also applicable to memory chips other than the flash memory chips. Accordingly, the disclosure is also applicable to a memory apparatus in which the memory chips are different from the flash memory chips are stacked.

The preferable embodiment of the disclosure had been described in detail above, but the disclosure is not limited to a specific embodiment. It will be apparent to those skilled in the art that various modifications and variations can be made to the structure of the present disclosure without departing from the scope or spirit of the disclosure.

What is claimed is:

1. A semiconductor memory device, comprising
a plurality of memory chips,
each of the memory chips comprising: an output circuit for outputting data; and a data strobe signal output circuit, outputting a data strobe signal for defining a timing of the data output from the output circuit,
the semiconductor memory device further comprising:
a plurality of output terminals capable of outputting the data output from each of the output circuits of the memory chips to an external part; and
one data strobe signal terminal for outputting the data strobe signal to the external part,
the semiconductor memory device supplies the data strobe signal from each of the data strobe signal output circuits of the memory chips to said one data strobe signal terminal,
the output circuit of each of the memory chips includes n parallel inverters for outputting the data where n is an integer being 2 or greater, the data strobe signal output circuit of each of the memory chips includes n parallel inverters obtained by duplicating n said parallel inverters of the output circuit, and
when the plurality of memory chips are stacked, each of the data strobe signal output circuits supplies the data strobe signal output by a part of the inverters fewer than n said parallel inverters to the data strobe signal terminal.

2. The semiconductor memory device as recited in claim 1, wherein
when m said memory chips are stacked where m is an integer being 2 or greater, the data strobe signal output circuit of each of the memory chips supplies the data strobe signal output from n/m said parallel inverters to the data strobe signal terminal.

3. The semiconductor memory device as recited in claim 1, wherein
a first data strobe signal output from the data strobe signal output circuit of a first memory chip defines a first timing of data output from the output circuit of the first memory chip,
a second data strobe signal output from the data strobe signal output circuit of a second memory chip defines a second timing of data output from the output circuit of the second memory chip, and
the data strobe signal terminal outputs a third data strobe signal, the third data strobe signal using a third timing to define the data output by each of the output circuits of the first memory chip and the second memory chip based on the first data strobe signal and the second data strobe signal.

4. The semiconductor memory device as recited in claim 1, wherein a number of the output terminals is equal to a number of bits of the data output by each of the output circuits of the memory chips.

5. The semiconductor memory device as recited in claim 1, wherein
the memory chip include an NAND memory cell array.

6. The semiconductor memory device as recited in claim 1, wherein
the semiconductor memory device further includes a clock terminal receiving a clock signal from the external part, and each of the output circuits of the memory chips outputs the data in synchronization with the clock signal input from the clock terminal.

7. The semiconductor memory device as recited in claim 6, wherein
the memory chips are installed with serial peripheral interfaces.

8. An output method of data strobe signal, adapted for a semiconductor memory device having a plurality of memory chips, comprising
connecting output nodes of each of output circuits with a plurality of external terminals by supplying data output from each of the output circuits of the memory chips to the external terminals, and
connecting an output node of each of data strobe signal output circuits with one data strobe signal terminal by supplying a data strobe signal output from each of the data strobe signal output circuits of the memory chips to said one data strobe signal terminal,
wherein when the data are output to an external part from the external terminals, said one data strobe signal terminal outputs a data strobe signal for defining a timing of the data output from the external terminals to the external part,
the output circuit of each of the memory chips includes n parallel inverters for outputting the data where n is an integer being 2 or greater, the data strobe signal output circuit of each of the memory chips includes n parallel inverters obtained by duplicating n said parallel inverters of the output circuit, and
when m said memory chips are stacked where in is an integer being 2 or greater, each of the data strobe signal output circuits performs an operation of supplying the data strobe signal output from n/m said parallel inverters to the data strobe signal terminal by the data strobe signal output circuit of each of the memory chips.

9. The output method of data strobe signal as recited in claim 8, wherein
the plurality of memory chips are stacked.

10. A manufacturing method of semiconductor memory device, adapted for a semiconductor memory device having a plurality of memory chips being stacked, comprising
preparing m memory chips where m is an integer being 2 or greater, wherein in each of the memory chips, an output circuit for outputting data includes n parallel inverters where n is an integer being 2 or greater, and a data strobe signal output circuit for outputting a data strobe signal of each of the memory chips includes n parallel inverters obtained by duplicating n said parallel inverters of the output circuit;
stacking m said memory chips; and
performing a setup on each of the data strobe signal output circuits by supplying the data strobe signal output from n/m said parallel inverters to one data strobe signal terminal by each of data strobe signal output circuits of m said memory chips.

11. The manufacturing method of semiconductor memory device as recited in claim 10, wherein
the setup is performed by using a wire-bonding option or a fuse option.

* * * * *